United States Patent [19]

Frazier et al.

[11] Patent Number: 5,175,075
[45] Date of Patent: Dec. 29, 1992

[54] POSITRON BEAM LITHOGRAPHY

[75] Inventors: Gary A. Frazier; Keith Bradshaw, both of Garland, Tex.

[73] Assignee: Texas Instruments Incorporated, Dallas, Tex.

[21] Appl. No.: 443,972

[22] Filed: Nov. 30, 1989

[51] Int. Cl.⁵ .............................................. G03C 5/00
[52] U.S. Cl. .................................. 430/296; 430/330; 430/326; 156/643; 156/659.1; 156/668; 219/121.68; 219/121.69
[58] Field of Search ................ 430/296, 330, 326; 156/643, 659.1, 668; 219/121.68, 212.69

[56] References Cited

U.S. PATENT DOCUMENTS

| | | | |
|---|---|---|---|
| 3,457,408 | 7/1969 | Alter | 430/953 |
| 4,430,419 | 2/1984 | Harada | 430/330 |
| 4,992,746 | 2/1991 | Martin | 378/34 |

OTHER PUBLICATIONS

Howard et al, "Nanometer-Scale Fabrication Techniques", Academic Press 1982, VLSI Electronics: Microstructure Science, vol. 5, pp. 145-189.
Cleaver et al, "A Combined Electron and Ion Beam Lithography System", 1985 American Vacuum Society, J. Vac. Sci. Technol. B 3(1), Jan./Feb. 1982, pp. 144-147.

Primary Examiner—Ellis P. Robinson
Assistant Examiner—J. Weddington
Attorney, Agent, or Firm—Dana L. Burton; Richard A. Stoltz; Richard L. Donaldson

[57] ABSTRACT

Resist (402) is exposed by a beam of positrons (320) is an apparatus (300) similar to an electron beam lithography machine.

16 Claims, 5 Drawing Sheets

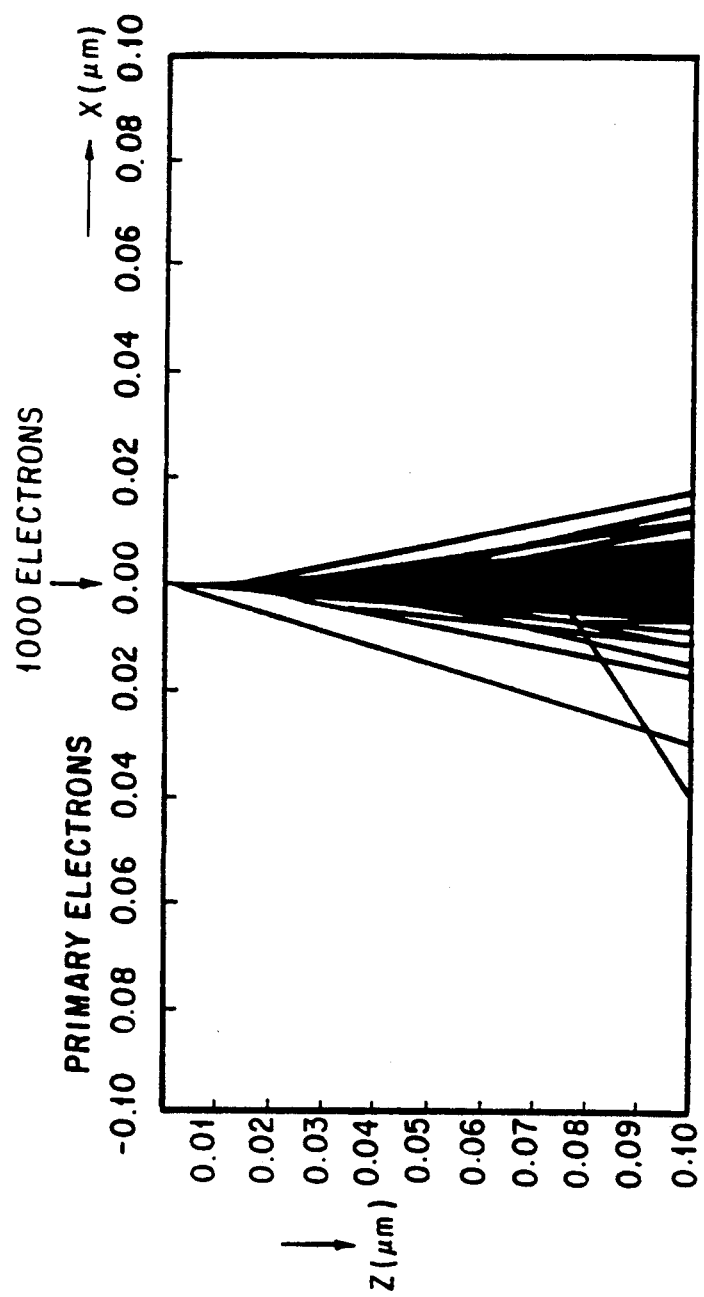

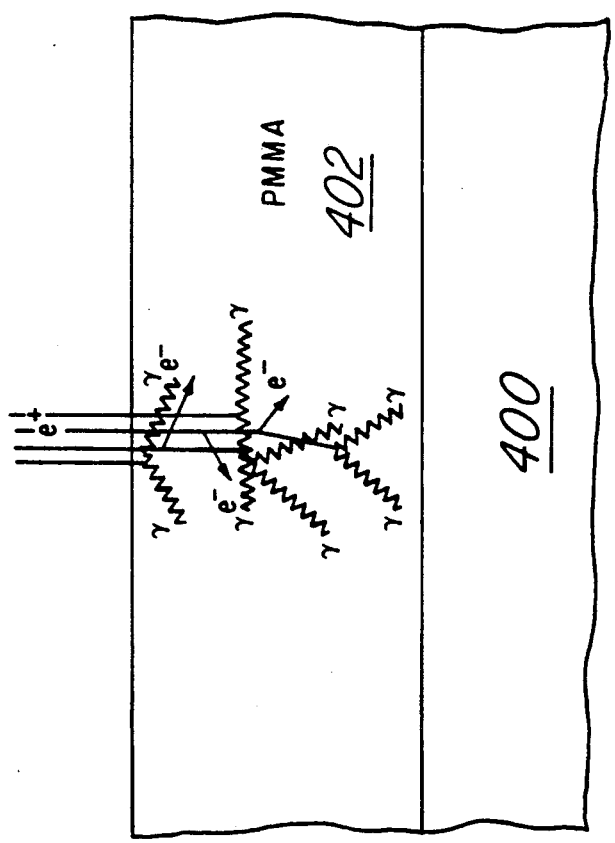

POSITRON BEAM LITHOGRAPHY

BACKGROUND OF THE INVENTION

1. Field of the Invention

The present invention relates to fabrication of items with small features, and, more paticularly, to lithographic methods of fabrication such as are used in semiconductor integrated circuits.

2. Description of the Related Art

Semiconductor-based electronic integrated circuits have progressively shrunk in feature size and increased in complexity since their invention in 1958, and currently mass-produced integrated circuits such as computer memory chips have feature sizes on the order of 1 $\mu$m. Such integrated circuits are typically fabricated using photolithography which patterns a layer of photoresist (a radiation sensitive material) on the in-process integrated circuit by exposure of the photoresist to masked radiation such as visible light or ultraviolet light. The radiation causes a chemical change in the photoresist, and the exposed areas of the photoresist may then be selectively removed (positive photoresist) or retained (negative photoresist) by contact with a solvent. The patterned photoresist is then used as a mask in a step (such as etching, deposition, ion implantation, etc.) of the fabrication process for the integrated circuit.

FIGS. 1a–c illustrate in cross sectional elevation views the formation and use of photoresist as an implantation mask. As shown in FIG. 1a photoresist (positive) 102 is applied to substrate 104, photoresist 102 is typically 1 $\mu$m thick. Next, ultraviolet radiation 106 is passed through pattern mask 108 and exposes photoresist 102 in the pattern of mask 108; see FIG. 1b. The exposed portion of photoresist 102 is then removed (photoresist 102 is developed) by dissolution in a solvent, and the developed photoresist 102 may then be used as a mask for ion implantation of dopants 110 to form doped regions 112 in substrate 104; see FIG. 1c.

The feature size obtainable using photoresist lithography is limited by diffraction effects, with resulting dimensions having a lower limit of about 0.1 $\mu$m even if ultraviolet light is used for the photoresist exposure. That is, in the exposure step illustrated in FIG. 1b, the wavelength of light 106 is comparable to the size of the openings in mask 108 and the light passing through the openings is severely diffracted. In contrast, the use of resists sensitive to short wavelength entities such as electrons, ions, or x-rays will eliminate this diffraction limitation, but then the limitations of the resist material itself become important. For example, electron beams can be focussed down to a spot size of the order of 10 Å, and can be used to directly write on (expose) a resist layer without the use of a pattern mask. The typical electron beam resist, polymethylmethacrylate (PMMA), is exposed by the incident electrons breaking bonds (e.g., carbon-carbon bonds) to make the PMMA more soluble in a developer such as methylisobutylketone (MIBK). A spot size of less than 10 Å for the incident electron beam can be formed and accurately controlled with digital and analog techniques; however, the incident electrons typically have energies on the order of 20 KeV and create secondary electrons as they inelastically scatter in the PMMA. These secondary electrons have energies up to about 100 eV and can also break carbon-carbon bonds. The secondary electrons have a range of up to about 100 Å from the incident flux, and these account for the feature size limitation in PMMA of about 125 Å. Molecular size and statistical effects may also limit feature size. See R. Howard et al, Nanometer-Scale Fabrication Techniques in 5 VLSI Electronics: Microstructure Science, pp. 150-153 (Academic Press 1982). FIGS. 2a–b are cross sectional elevation views of Monte Carlo simulations that illustrate the spreading of the incident electrons and the secondary electrons in a layer of PMMA.

Statistical effects due to fluctuations in the flux of incident electrons and fluctuations in the number of secondary electrons also affect the feature size limitation for electron beam direct write exposure of resist. Further, the incident electrons may also scatter off of the substrate back into the resist and further expose the resist. The overall result is a difficulty in achieving feature sizes approaching 100 Å.

Attempts to overcome the feature size limitations of standard lithography include use of thin resist layers (to avoid secondary electron spread as in FIG. 2b), thin substrates (to avoid backscattering of incident electrons), multilayer resists (effectively thin resist plus lower layers absorb backscatter). However, these approaches are not yet useful in high volume manufacturing.

J. Cleaver et al, A Combined Electron and Ion Beam Lithography System, 3 J. Vac. Sci. Tech. B 144 (1985) theoretically analyze a combination of ion beams and electron beams in a single machine for microlithography.

SUMMARY OF THE INVENTION

The present invention provides for the use of antiparticles in resist exposure. This solves the problems of the known electron beam methods of resist exposure for small feature size lithography by reducing secondary electron creation and backscattering of incident electrons: the antiparticles are annihilated by electrons or nucleons in the resist yielding gamma rays that have only limited interaction with the resist. Preferred embodiments include use of an electron beam lithography machine but with a positron source (such as Na$^{22}$) in place of the electron gun. Other preferred embodiments use a positron beam to form a latent image by change of resist sensitivity to electrons, so subsequent exposure to an electron beam develops the latent image.

BRIEF DESCRIPTION OF THE DRAWINGS

The drawings are schematic for clarity.

FIGS. 2a–b illustrate scattering of incident electrons and secondary electrons during prior art electron beam resist exposure;

FIG. 4 illustrates first preferred embodiment resist exposure.

DESCRIPTION OF THE PREFERRED EMBODIMENTS

Figure 1A:
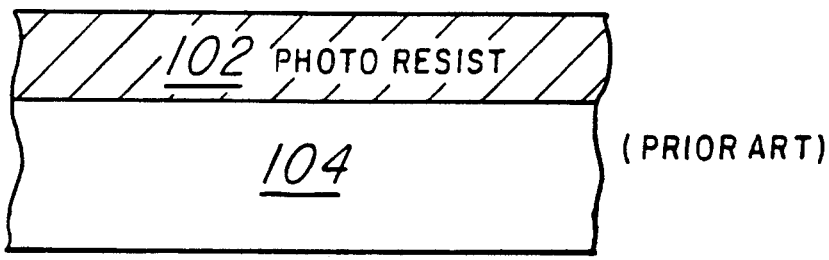
FIGS. 1a–c are cross sectional elevation views of prior art lithography.
Figure 1B:
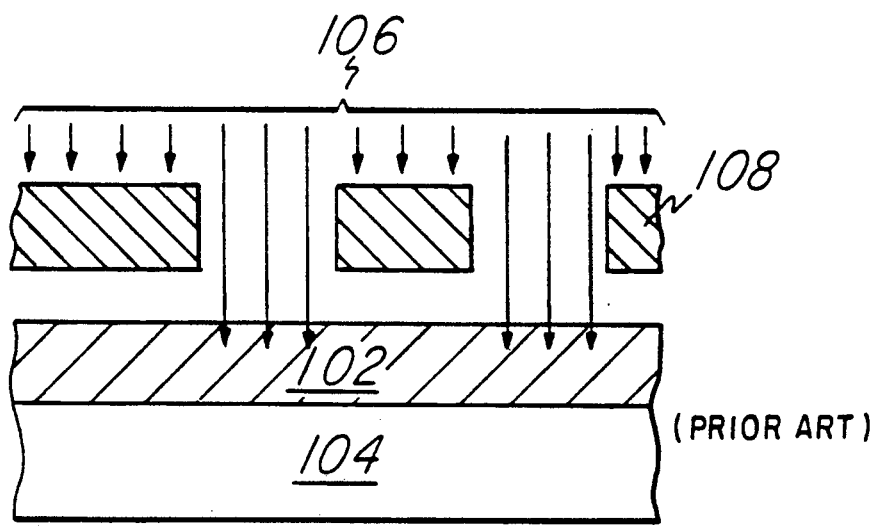
Figure 1C:
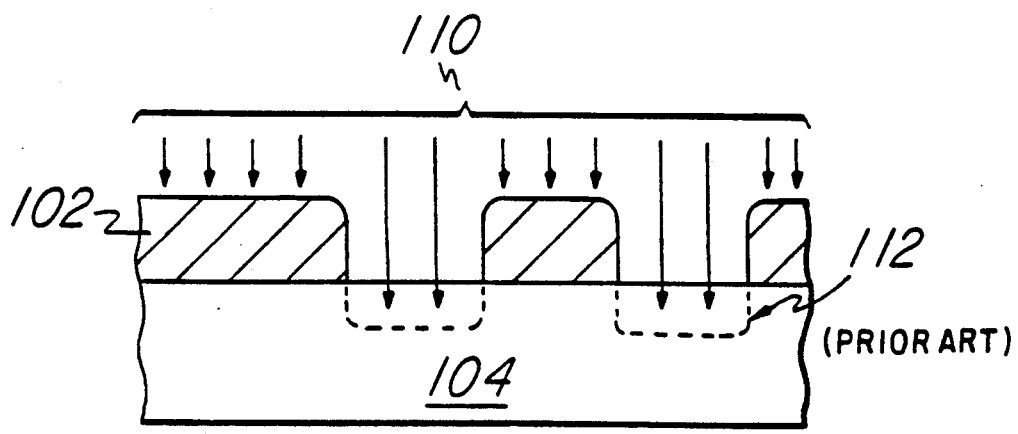
Figure 2B:
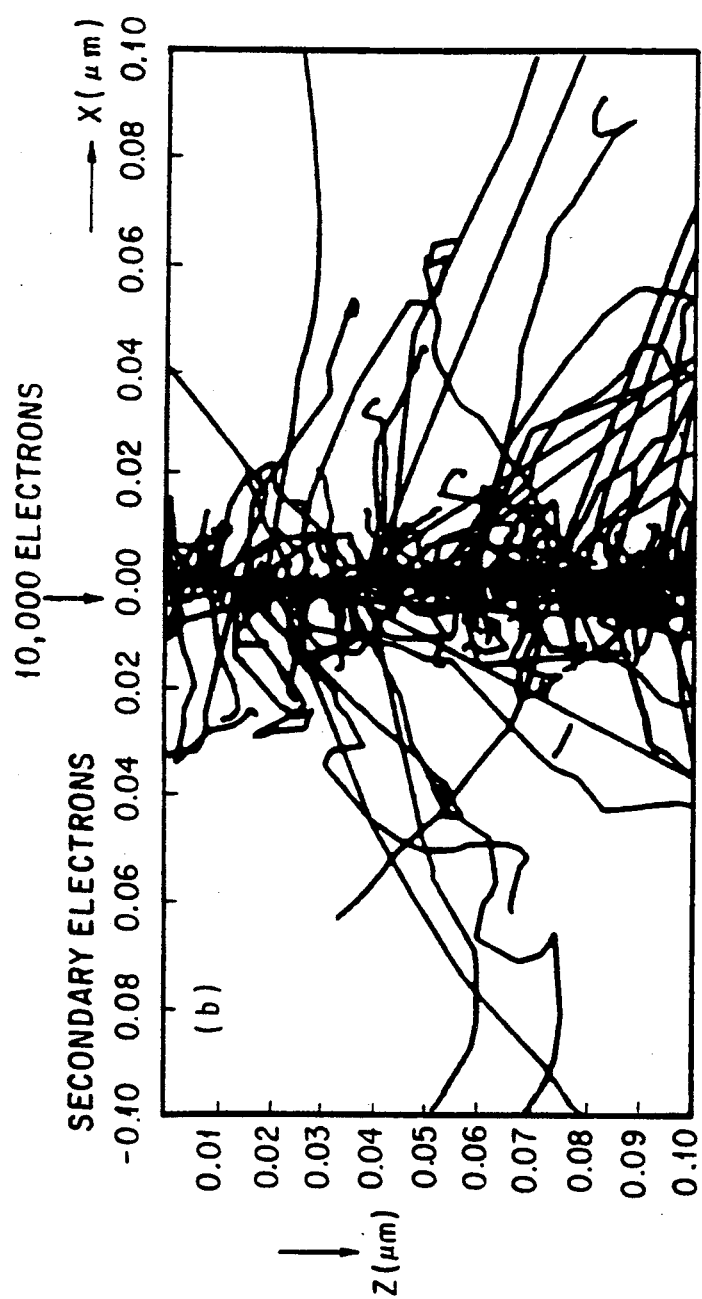
Figure 3:
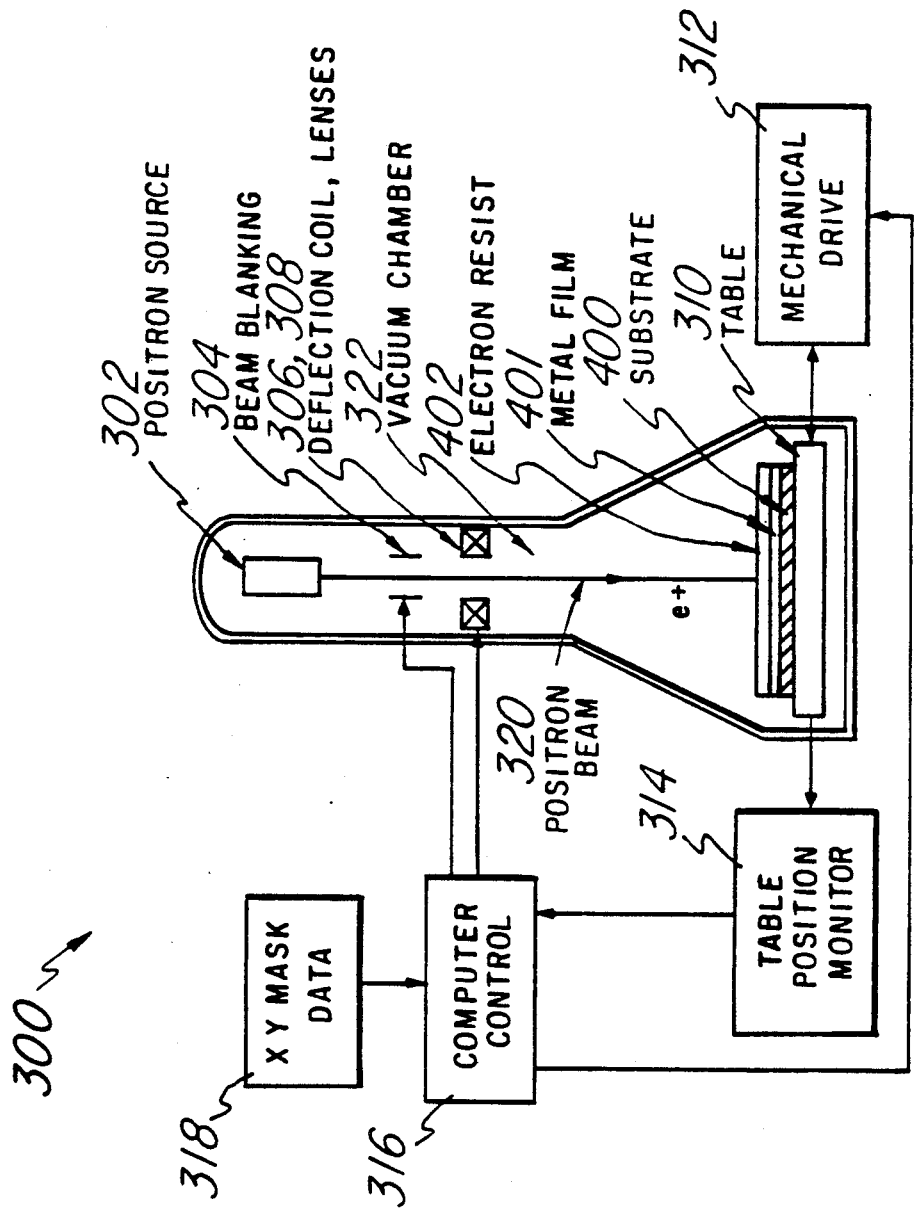
FIG. 3 is a schematic cross sectional elevation view of a first preferred embodiment apparatus.

FIG. 3 is a schematic cross sectional elevation view of a first preferred embodiment apparatus, generally denoted 300, for using the first preferred embodiment method of electron beam lithography. Apparatus 300 is essentially a standard electron beam lithography machine but with a positron source in place of the typical electron gun and typically would include multiple lenses rather than the single lens illustrated. Apparatus 300 includes a sodium isotope ($Na^{22}$) source of positrons 302, a beam blanker 304 (which just electrostatically deflects the beam into a physical stop), deflection coils 306 which provide the scanning of the beam across the target substrate, electrostatic and magnetic lenses 308 for focussing the beam of positrons to a spot on the target substrate, movable table 310 for holding the substrate, mechanical drive 312 for positioning table 310, position monitor 314 for detecting the position of table 310, pattern data memory 318 which is input to computer 316 for controlling beam blanker 304, deflection coils 306, lenses 308, and mechanical drive 312. Positron beam 320 and target substrate are held within vacuum chamber 322.

Positron source 302 includes a small block of sodium chloride with a portion of the sodium of isotope 22 ($Na^{22}$). The block is suspended in a vacuum chamber and emits about $10^9$ positrons per second from the decay of the $Na^{22}$ into $Ne^{22}$. The positrons are emitted isotropically with energies on the order of 1 MeV, and about 5-10% are electrostatically collected and slowed down to about 1 eV to form positron beam 320. These 1 eV positrons constitute a current of about 10 pA. Alternatively, the positrons collected can be slowed to energies of about 20 KeV to form positron beam 320, and then immediately prior to beam 320 impinging resist 402 a retarding screen can drop the energy to about 1 eV. A higher energy beam 320 results in less Coulombic spreading due to the shorter time of flight, but a low beam current (10 pA as opposed to typical 1 nA electron beams) implies low charge density and minimal Coulombic spreading so high kinetic energies are not necessary.

The first preferred embodiment method of lithography proceeds as follows:

(a) Coat substrate 400 with PMMA (polymethylmethacrylate) 402 to a thickness of 1 $\mu$m; this coating may be obtained by spinning PMMA 402 onto substrate 400. Note that substrate 400 may be a semiconductor such as gallium arsenide (GaAs) or silicon already coated with layers of dielectrics, semiconductors, and conductors such as metal layer 401, and PMMA 402 is spun onto the top layer. Insert coated substrate 400 onto table 310 in apparatus 300. The pattern for PMMA 402 exposure is stored in memory 318 of apparatus 300.

(b) Activate positron source 302 to generate positron beam 320 and raster scan positron beam 320 across PMMA 402 on coated substrate 400 by deflection coils 306 with the intensity of positron beam 320 switched between zero and 10 pA by beam blanker 304. Lenses 308 focus beam 320 to a spot size of 10 Å at the top of PMMA 402. The positrons in beam 320 have an average energy of about 1 eV, and upon penetrating PMMA 402 break chemical bonds (including the carbon-carbon polymerization bonds) due to their annihilation of electrons constituting the chemical bonds. The scanning rate is set so that the 10 pA beam provides a sufficient dose of positrons to expose PMMA 402, and positron beam 320 is effectively interrupted to achiveve pattern definition. The inelastic scattering of the positrons produces secondary electrons analogous to the electrons in an electron beam inelastically scattering; however, the low energy of the positrons implies little inelastic scattering because the bonding energy of electrons in PMMA 402 is comparable to the kinetic energy of the positrons and any secondary electrons will have negligible energy and not significantly break chemical bonds. In effect, low energy positrons generate many fewer secondary electrons than a typical electron beam but are just as or more effective in breaking chemical bonds because the cross section for annihilation is large and the offending chemical bond is literally removed. Because annihilation products (gamma rays) only weakly interact with PMMA 402, low energy positron exposure of PMMA 402 does not have the spread of electron beam exposure; see schematic illustration in FIG. 4 showing positrons inelastically scattering to generate secondary electrons and annihilating. Thus the more efficient bond breaking of positrons permits a low energy beam and suppression of secondary electrons and exposure broadening.

Because the resist chemical bond electron is truly destroyed rather than just scattered, regeneration of the bond is unlikely. Thus resists that otherwise suffer from a loss of definition through bond reformation may be used with positron beam exposure.

If positron beam 320 were of the same energy (20 KeV) as a typical electron beam, then the inelastic scattering and secondary electron generation within PMMA 402 would be comparable to that of an electron beam. However, even high energy positron beams have advantages over electron beams for resist exposure: A typical electron beam penetrates PMMA 402 and scatters off of substrate 400 (or metal layer 401) and generates large numbers of secondary electrons. Contrarily, a positron beam penetrating PMMA 402 will have a large annihilation cross section in substrate 400 (or especially in metal layer 401) and not generate as many secondary electrons. Further, a fraction of the positrons will be annihilated within PMMA 402 and not generate as many secondary electrons as a comparable electron.

(c) Remove coated substrate 400 with PMMA 402 from chamber 322, and develop the exposed PMMA 402 with a mixture of methyl isobutyl ketone and isopropyl alcohol; that is, PMMA 402 is a positive resist with the exposed portion (broken bonds) removed during development. Then use the thus patterned PMMA 402 as a mask for ion implantation, etching, or lift-off deposition in the standard manner.

Second preferred embodiment method of lithography is similar to the first preferred embodiment and uses apparatus 300; however, rather than raster scan positron beam 320 at a rate that will expose PMMA 402 on a single pass, the scan rate is increased so that multiple (e.g., five or ten) passes over the same area are required to expose PMMA 402. Thus the second preferred embodiment method averages out the statistical fluctuations in apparatus 300 but does not require increased exposure time because the scan rate is higher.

Third preferred embodiment method of lithography also uses apparatus 300, but prior to positron beam exposure the method partially exposes PMMA 402 by a flood of electrons. This flood of electrons does not break a sufficient number of chemical bonds to expose PMMA 402; however, a significant fraction (e.g., 30%) of an exposure is achieved so positron beam 320 has fewer chemical bonds to break to achieve full exposure and may operate at higher scan rates or lower beam currents or both.

Fourth preferred embodiment method of lithography also uses apparatus 300, but with a negative resist. (PMMA can also be used as a negative resist but typically requires a much larger dose for exposure: PMMA as a negative resist is exposed by the incident electrons or positrons disrupting chemical bonds and inducing formation of cross-linking bonds to increase molecular size and decrease solubility.) The method forms a latent image in the negative resist with positron beam 320 by annihilating electrons that would participate in the cross-linking bonding. Subsequently, a flood electron exposure will form cross-linking bonds in the complement of the latent image, and development will remove the resist at the latent image location. In effect, the negative resist has been used as a positive resist, but with the latent image formed by low energy positrons to avoid undesired exposure caused otherwise by secondary electron spreading.

Fifth preferred embodiment lithography method and apparatus is similar to the first preferred embodiments but without resist and with heavier annihilative particles. In particular, the fifth preferred embodiment uses a source of negative pi mesons (or antiprotons or other strongly interacting particles that will not be Coulombically repelled from the substrate nuclei) in place of positron source 302 (this source could be a proton accelerator plus target) and relies on the strong interaction energy released to directly etch a pattern in substrate 400 or metal film 401. Analogously, antineutrons could be used to directly etch substrate 400 or metal film 401, but the patterning would be with a mask because the neutral beam could not be focussed with electrostatic lenses and the magnetic dipole moment of neutrons is not useful for magnetic lenses. Of course, the mask material will also be etched. Indeed, any of the beam exposure methods described supra could also be operated instead with a mask plus blanket exposure.

MODIFICATIONS AND ADVANTAGES

Various modifications of the preferred embodiment devices and methods may be made while retaining the features of annihilative matter or strongly interacting matter as an exposing or etching agent.

For example, the types and dimensions and shapes and thicknesses of the substrates and resist layers could be varied, the beam of particles could interact with substrate atoms to form dopants, and the embodiments requiring two different particle types could be used in an apparatus with two beam paths and sets of lenses that converge to a common spot for exposure or etching or doping and the two particle types perform their functions essentially simultaneously.

For further example, resists exist that are polymerized optically using ultraviolet light. The fourth preferred embodiment could be varied such that an initial pattern produced using positron annihilation of certain polymer bonds frustrates a blanket development of the thus-formed latent image by a flood of ultraviolet light.

The invention provides the advantage of low secondary electron generation rate for resist exposure.

What is claimed is:

1. A method of lithography comprising the step of:
  (a) exposing a resist with annihilative particles wherein antiparticles are annihilated by electrons or nucleons in said resist to form a mask.
2. The method of claim 1, wherein:
  (a) said particles have a kinetic energy on the order of 1 eV.
3. The method of claim 1, wherein:
  (a) said particles are positrons.
4. The method of claim 1, wherein:
  (a) said resist is PMMA.
5. The method of claim 1, further comprising the step of:
  (a) exposing said resist to a second type of particles which differ from said annihilative particles.
6. The method of claim 5, wherein:
  (a) said exposure by said annihilative particles forms a latent image which deters exposure of said resist by said second type of particles.
7. The method of claim 1, wherein:
  (a) said annihilative particles selectively expose said resist by scanning a variable-intensity beam of said annihilative particles across said resist.
8. The method of claim 7, wherein:
  (a) said scanning by said beam of annihilative particles includes multiple scans over areas of said resist with the dose of each of said scans insufficient to expose said resist but with the cumulative dose of all of said multiple scans sufficient to expose said resist.
9. The method of claim 1, wherein:
  (a) said annihilative particles selectively expose said resist by passing said annihilative particles through a mask.
10. A method of lithography comprising the step of:
  (a) etching a material with annihilative particles wherein antiparticles are annihilated by electrons or nucleons in said material such that an etched pattern is obtained.
11. The method of claim 10, wherein:
  (a) said particles have a kinetic energy on the order of 1 eV.
12. The method of claim 10, wherein:
  (a) said particles are selected from the group consisting of anti-protons, anti-neutrons, and mesons.
13. The method of claim 10, wherein:
  (a) said material is a semiconductor.
14. The method of claim 10, wherein:
  (a) said annihilative particles selectively etch said material by scanning a variable-intensity beam of said annihilative particles across said material.
15. The method of claim 14, wherein:
  (a) said scanning by said beam of annihilative particles includes multiple scans over areas of said material with the dose of each of said scans insufficient to etch said material but with the cumulative dose of all of said multiple scans sufficient to etch said material.
16. The method of claim 10, wherein:
  (a) said annihilative particles selectively etch said material by passing said annihilative particles through a mask.

* * * * *